(12) United States Patent
Lu et al.

(10) Patent No.: US 10,892,271 B2
(45) Date of Patent: Jan. 12, 2021

(54) INTERCONNECT STRUCTURE OF THREE-DIMENSIONAL MEMORY DEVICE

(71) Applicant: Yangtze Memory Technologies Co., Ltd., Hubei (CN)

(72) Inventors: Zhenyu Lu, Hubei (CN); Lidong Song, Hubei (CN); Yongna Li, Hubei (CN); Feng Pan, Hubei (CN); Steve Weiyi Yang, Hubei (CN); Wenguang Shi, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 1 day.

(21) Appl. No.: 16/046,873

(22) Filed: Jul. 26, 2018

(65) Prior Publication Data

US 2019/0067314 A1    Feb. 28, 2019

Related U.S. Application Data

(63) Continuation of application No. PCT/CN2018/077741, filed on Mar. 1, 2018.

(30) Foreign Application Priority Data

Mar. 8, 2017    (CN) .......................... 2017 1 0134788

(51) Int. Cl.
*H01L 27/11575* (2017.01)
*H01L 27/1157* (2017.01)
(Continued)

(52) U.S. Cl.
CPC .. *H01L 27/11575* (2013.01); *H01L 21/76895* (2013.01); *H01L 23/5226* (2013.01);
(Continued)

(58) Field of Classification Search
CPC ......... H01L 27/11551; H01L 27/11556; H01L 27/11578; H01L 27/11582;
(Continued)

(56) References Cited

U.S. PATENT DOCUMENTS 9,105,514 B2    8/2015  Shin
9,305,934 B1    4/2016  Ding et al.
(Continued)

FOREIGN PATENT DOCUMENTS

CN    102915955 A    2/2013
CN    103117282 A    5/2013
(Continued)

OTHER PUBLICATIONS

International Search Report and Written Opinion of the International Searching Authority directed to related International Patent Application No. PCT/CN2018/077741, dated May 29, 2018; 10 pages.
(Continued)

*Primary Examiner* — Sue A Purvis
*Assistant Examiner* — Scott Stowe
(74) *Attorney, Agent, or Firm* — Sterne, Kessler, Goldstein & Fox P.L.L.C.

(57) ABSTRACT

Embodiments of interconnect structures of a three-dimensional (3D) memory device and method for forming the interconnect structures are disclosed. In an example, a 3D NAND memory device includes a substrate, an alternating layer stack including a staircase structure on the substrate, and a barrier structure extending vertically through the alternating layer stack. The alternating layer stack includes an alternating dielectric stack and an alternating conductor/dielectric stack. The alternating dielectric stack includes dielectric layer pairs enclosed by at least the barrier structure. The alternating conductor/dielectric stack includes con-
(Continued)

ductor/dielectric layer pairs. The memory device further includes a channel structure and a slit structure each extending vertically through the alternating conductor/dielectric stack, an etch stop layer on an end of the channel structure, and first contacts. Each of a conductor layer of the alternating conductor/dielectric stack in the staircase structure, the etch stop layer, and the slit structure is in contact with one of the first contacts.

12 Claims, 14 Drawing Sheets

(51) Int. Cl.
    H01L 27/11582    (2017.01)
    H01L 21/768      (2006.01)
    H01L 23/522      (2006.01)
    H01L 23/00       (2006.01)
    H01L 27/11519    (2017.01)
    H01L 27/11548    (2017.01)
    H01L 27/11556    (2017.01)
    H01L 27/11565    (2017.01)
    H01L 27/11524    (2017.01)

(52) U.S. Cl.
    CPC ......... *H01L 24/05* (2013.01); *H01L 27/1157* (2013.01); *H01L 27/11519* (2013.01); *H01L 27/11548* (2013.01); *H01L 27/11556* (2013.01); *H01L 27/11565* (2013.01); *H01L 27/11582* (2013.01); *H01L 27/11524* (2013.01); *H01L 2224/05009* (2013.01); *H01L 2224/0557* (2013.01)

(58) Field of Classification Search
    CPC ......... H01L 27/11575; H01L 27/11519; H01L 27/11548; H01L 27/11565; H01L 27/1157
    See application file for complete search history.

(56) References Cited

U.S. PATENT DOCUMENTS

| | | | |
|---|---|---|---|
| 9,520,407 | B2 | 12/2016 | Fukuzumi et al. |
| 9,524,903 | B2 | 12/2016 | Lee |
| 9,716,137 | B1 | 7/2017 | Hu et al. |
| 10,304,498 | B2 | 5/2019 | Tanzawa |
| 2012/0061744 | A1 | 3/2012 | Hwang et al. |
| 2012/0077320 | A1 | 3/2012 | Shim et al. |
| 2013/0126957 | A1 | 5/2013 | Higashitani et al. |
| 2013/0203227 | A1 | 8/2013 | Huo et al. |
| 2014/0061748 | A1 | 3/2014 | Lee |
| 2015/0129878 | A1* | 5/2015 | Shin ............... H01L 27/11578 257/66 |
| 2015/0287739 | A1 | 10/2015 | Lee |
| 2016/0049421 | A1 | 2/2016 | Zhang et al. |
| 2016/0056210 | A1 | 2/2016 | Takaki |
| 2016/0064281 | A1 | 3/2016 | Izumi et al. |
| 2016/0148946 | A1 | 5/2016 | Hironaga |
| 2016/0163732 | A1 | 6/2016 | Lim et al. |
| 2016/0322381 | A1 | 11/2016 | Liu et al. |
| 2017/0179154 | A1* | 6/2017 | Furihata ........... H01L 27/11524 |
| 2019/0067314 | A1 | 2/2019 | Lu et al. |

FOREIGN PATENT DOCUMENTS

| | | |
|---|---|---|
| CN | 103681684 A | 3/2014 |
| CN | 104979351 A | 10/2015 |
| CN | 106920796 A | 7/2017 |
| CN | 107771356 A | 3/2018 |
| KR | 1020120031658 A | 4/2012 |
| TW | 201503289 A | 1/2015 |
| TW | 201532246 A | 8/2015 |
| TW | 201605015 A | 2/2016 |
| TW | I-566447 B | 1/2017 |
| WO | WO 2016/028484 A1 | 2/2016 |
| WO | WO 2017/112014 A1 | 9/2016 |
| WO | WO-2017034646 A1 | 3/2017 |

OTHER PUBLICATIONS

International Preliminary Report on Patentability directed to related International Patent Application No. PCT/CN2018/077741, dated Sep. 10, 2019; 7 pages.
Korean Application No. 10-2019-7029399, Office Action dated Sep. 18, 2020; English Translation from EPO Global Dossier, 8 pages.
Chinese Application No. 201811524008.2 Office Action dated Aug. 5, 2020; English Translation from EPO Global Dossier, 11 pages.
Office Action directed to related Japanese Patent Application No. 2016-570607, dated Nov. 16, 2020, with attached English-language translation; 14 pages.

* cited by examiner

INTERCONNECT STRUCTURE OF THREE-DIMENSIONAL MEMORY DEVICE

CROSS-REFERENCE TO RELATED APPLICATIONS

This application claims priority to PCT/CN2018/077741 filed on Mar. 1, 2018, which claims priority to Chinese Patent Application No. 201710134788.9 filed on Mar. 8, 2017, the entire contents of which are incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of 3D memory interconnects and fabrication methods thereof are disclosed herein.

According to some embodiments of the present disclosure, a 3D NAND memory device includes a substrate, an alternating layer stack including a staircase structure on the substrate, and a barrier structure extending vertically through the alternating layer stack. The alternating layer stack includes an alternating dielectric stack and an alternating conductor/dielectric stack. The alternating dielectric stack includes a plurality of dielectric layer pairs enclosed by at least the barrier structure. The alternating conductor/dielectric stack includes a plurality of conductor/dielectric layer pairs. The memory device further includes a channel structure and a slit structure each extending vertically through the alternating conductor/dielectric stack, an etch stop layer on an end of the channel structure, and a plurality of first contacts. Each of a conductor layer of the alternating conductor/dielectric stack in the staircase structure, the etch stop layer, and the slit structure is in contact with one of the plurality of first contacts.

In some embodiments, the etch stop layer includes one or more of polysilicon, titanium, titanium nitride, and tungsten. The barrier structure can include silicon oxide and silicon nitride. Each of the plurality of dielectric layer pairs can include a silicon oxide layer and a silicon nitride layer. Each of the plurality of conductor/dielectric layer pairs can include a metal layer and a silicon oxide layer.

In some embodiments, the memory device further includes a dummy channel structure extending vertically through the alternating conductor/dielectric stack.

In some embodiments, the memory device further includes an interconnect conductor layer and a contact layer. The contact layer can include a plurality of second contacts. Each of the conductor layer of the alternating conductor/dielectric stack in the staircase structure, the channel structure, and the slit structure can be electrically connected to the interconnect conductor layer by a corresponding first contact and a respective one of the plurality of second contacts.

In some embodiments, the memory device further includes a third contact (e.g., a through array contact (TAC)) extending vertically through the alternating dielectric stack enclosed by at least the barrier structure.

According to some embodiments of the present disclosure, a method for forming a 3D NAND memory device is disclosed. An alternating dielectric stack is formed on a substrate. The alternating dielectric stack includes a plurality of dielectric layer pairs, each of which includes a first dielectric layer and a second dielectric layer different from the first dielectric layer. A first staircase structure is formed in the alternating dielectric stack. A channel structure and a barrier structure each extending vertically through the alternating dielectric stack are formed. The barrier structure separates the alternating dielectric stack into a first portion enclosed by at least the barrier structure, and a second portion including the first staircase structure. An etch stop layer is formed on an upper end of the channel structure. A slit is formed. First dielectric layers in the second portion of the alternating dielectric stack are replaced with conductor layers through the slit to form an alternating conductor/dielectric stack including a plurality of conductor/dielectric layer pairs. A slit structure is formed by filling the slit with a conductor. A plurality of first contacts are formed. Each of a first conductor layer of the alternating conductor/dielectric stack in the first staircase structure, the etch stop layer, and the slit structure is in contact with one of the plurality of first contacts.

In some embodiments, a plurality of second contacts are formed. One of the plurality of second contacts can extend vertically through the first portion of the alternating dielectric stack enclosed by at least the barrier structure. Another one of the plurality of second contacts can be in contact with a second conductor layer of the alternating conductor/dielectric stack in the first staircase structure.

In some embodiments, a contact layer including a plurality of third contacts is formed. An interconnect conductor layer is formed above the contact layer. Each of the first conductor layer of the alternating conductor/dielectric stack in the first staircase structure, the channel structure, and the slit structure can be electrically connected to the interconnect conductor layer by a corresponding first contact and a respective one of the plurality of third contacts.

In some embodiments, each of the plurality of second contacts is electrically connected to the interconnect conductor layer by a respective one of the plurality of third contacts.

In some embodiments, prior to forming the slit, a doped region is formed in the substrate. The slit structure can be in contact with the doped region.

In some embodiments, a second staircase structure is formed in the alternating dielectric stack adjacent to the barrier structure.

In some embodiments, the etch stop layer includes one or more of polysilicon, titanium, titanium nitride, and tungsten. The barrier structure can include silicon oxide and silicon nitride. Each of the plurality of dielectric layer pairs can include a silicon oxide layer and a silicon nitride layer. Each of the plurality of conductor/dielectric layer pairs can include a metal layer and a silicon oxide layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
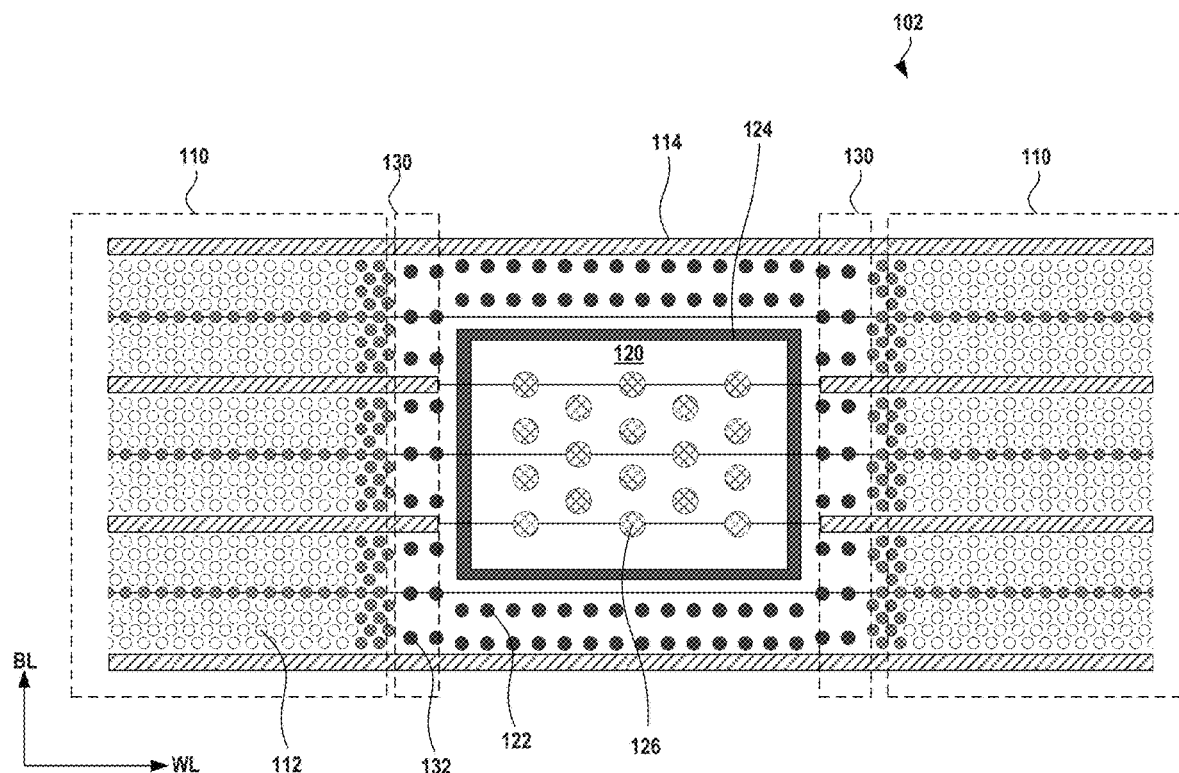
FIGS. 1A-1C illustrate various regions of a 3D memory device in the plan view, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide a 3D memory device with interconnect structures for a memory array (also referred to herein as an "array device"). The interconnect structures allow contacts to various memory array structures (e.g., NAND strings, gate line slits, word lines, etc.) to be fabricated in a limited number of steps (e.g., in a single step or in two steps), thereby reducing the process complexity and manufacturing cost. In some embodiments, the interconnect structures disclosed herein include bit lines in the top interconnect conductor layer, which is suitable for those 3D memory architectures in which the array device and the peripheral device formed on different substrates are joined by hybrid bonding in a face-to-face manner.

Moreover, the interconnect structures disclosed herein can include TACs for providing vertical interconnects between the stacked array device and peripheral device (e.g., for power bus and metal routing), thereby reducing metal levels and shrinking die size. In some embodiments, the TACs in the interconnect structures disclosed herein are formed through a stack of alternating dielectric layers, which can be more easily etched to form through holes therein compared with a stack of alternating conductor and dielectric layers.

Figure 1B:
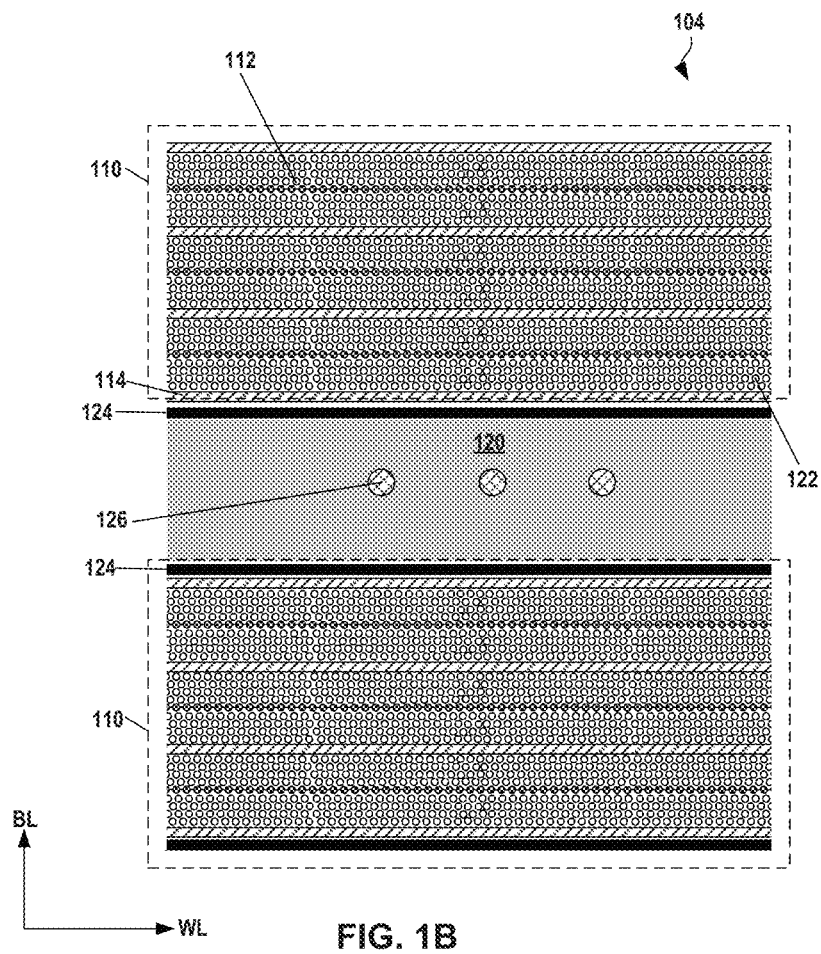
Figure 1C:
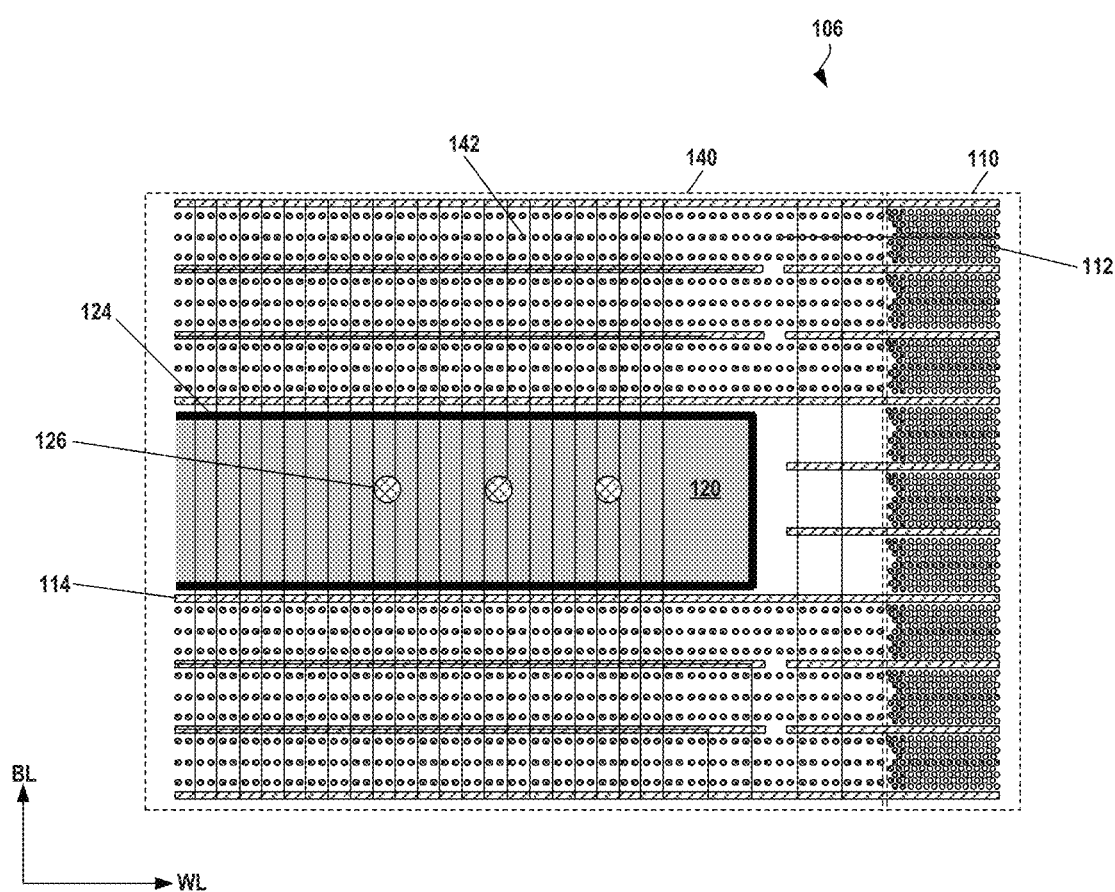

FIGS. 1A-1C illustrate various regions of a 3D memory device in the plan view, according to some embodiments of the present disclosure. FIG. 1A depicts a word line (WL) TAC region 102 of the 3D memory device, including NAND string regions 110, a TAC region 120, and top selective gate (TSG) staircase regions 130. NAND string regions 110 can include an array of NAND strings 112, each including a plurality of stacked memory cells. TSG staircase regions 130 can be disposed on the sides of NAND string regions 110 and adjacent to TAC region 120 in the plan view. TSG staircase regions 130 can include an array of TSG contacts 132 formed on a staircase structure (e.g., with two levels) for making electrical connections with the top selective gates of NAND strings 112 in NAND string region 110.

In some embodiments, TAC region 120 is between two TSG staircase regions 130 in the word line direction of the 3D memory device (labeled as "WL" in FIGS. 1A-1C). TAC region 120 can be defined by a barrier structure 124. Multiple TACs 126 can be formed in TAC region 120, which is enclosed laterally by barrier structure 124. In some embodiments, dummy channel structures 122 are formed outside TAC region 120 to provide mechanical support for the memory array structures. It is understood that dummy channel structures 122 can be formed in any regions outside TAC region 120, for example, along the edges of NAND string regions 110 adjacent to TSG staircase regions 130. As shown in FIG. 1A, WL TAC region 102 can also include a plurality of slit structures 114 each extending in the word line direction. At least some slit structures 114 can function as the common source contact for an array of NAND strings 112 in NAND string regions 110. Slit structures 114 can also divide the 3D memory device into multiple memory blocks and/or multiple memory fingers.

FIG. 1B depicts a bit line (BL) TAC region 104 of the 3D memory device, including NAND string regions 110 and a TAC region 120. NAND string regions 110 can include an array of NAND strings 112, each including a plurality of stacked memory cells. In some embodiments, TAC region 120 is between two NAND string regions 110 in the bit line direction of the 3D memory device (labeled as "BL" in FIGS. 1A-1C). TAC region 120 can be defined by a barrier structure 124 in conjunction with the edges of BL TAC region 104 of the 3D memory device. Multiple TACs 126 can be formed in TAC region 120, which is enclosed laterally by barrier structure 124 and the edges of BL TAC region 104. As shown in FIG. 1B, BL TAC region 104 can also include slit structures 114 each extending in the word line direction. At least some slit structures 114 can function as the common source contact for an array of NAND strings 112 in NAND string regions 110. Slit structures 114 can also divide the 3D memory device into multiple memory blocks and/or multiple memory fingers. In some embodiments, dummy channel structures 122 are formed in part of NAND string regions 110, for example, in the memory fingers that are adjacent to TAC region 120 in the bit line direction.

FIG. 1C depicts a staircase TAC region 106 of the 3D memory device, including a NAND string region 110, a staircase region 140, and a TAC region 120. NAND string region 110 can include an array of NAND strings 112, each including a plurality of stacked memory cells. Staircase region 140 can include a staircase structure and an array of word line contacts 142 formed on the staircase structure. In some embodiments, TAC region 120 is in staircase region 140. TAC region 120 can be defined by a barrier structure 124 alone or in conjunction with an edge of staircase TAC region 106 of the 3D memory device. Multiple TACs 126 can be formed in TAC region 120, which is enclosed laterally by at least barrier structure 124. As shown in FIG. 1C, staircase TAC region 106 can also include slit structures 114 each extending in the word line direction. At least some slit structures 114 can function as the common source contact for an array of NAND strings 112 in NAND string region 110. Slit structures 114 can also divide the memory device into multiple memory blocks and/or multiple memory fingers. In some embodiments, dummy channel structures are formed in staircase region 140 outside TAC region 120.

Figure 2:
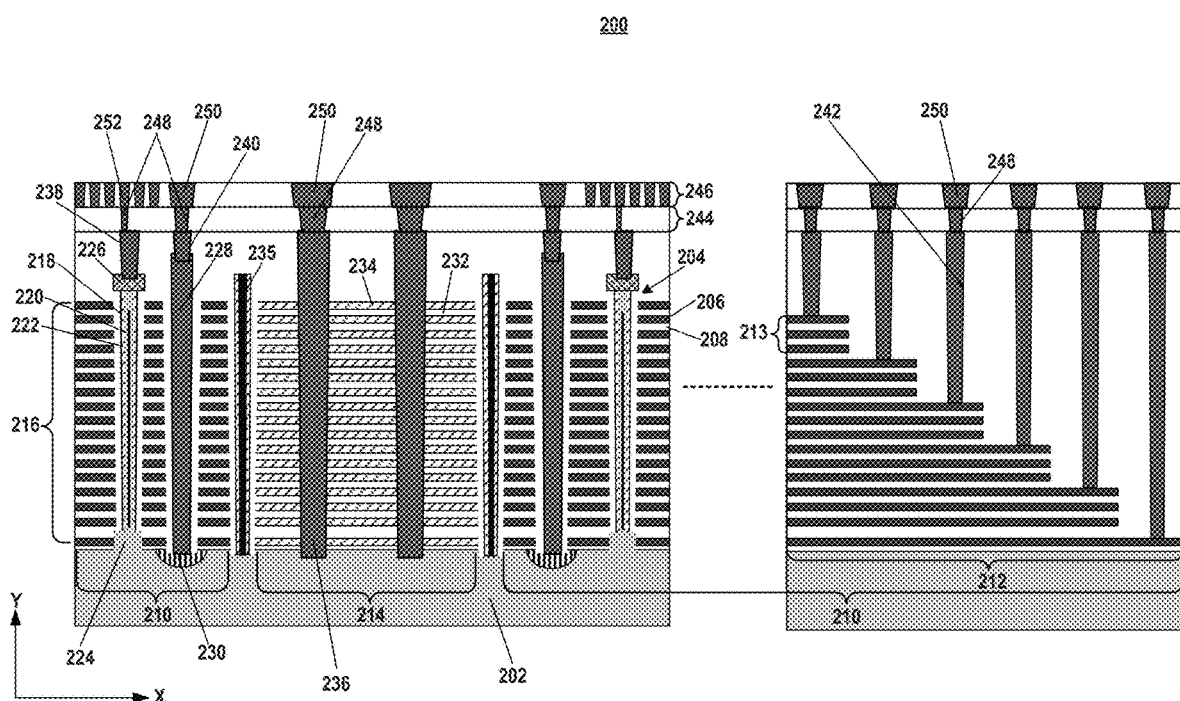
FIG. 2 illustrates a cross-section of a 3D memory device, according to some embodiments of the present disclosure.

FIG. 2 illustrates a cross-section of a 3D memory device 200, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, wet/dry etching, chemical mechanical polishing (CMP), or any combination thereof.

3D memory device 200 can include an array device above substrate 202. It is noted that x and y axes are added in FIG. 2 to further illustrate the spatial relationship of the components in 3D memory device 200. Substrate 202 includes two lateral surfaces (e.g., a top surface and a bottom surface) extending laterally in the x-direction (the lateral direction). As used herein, whether one component (e.g., a layer or a device) is "on," "above," or "below" another component (e.g., a layer or a device) of a semiconductor device (e.g., 3D memory device 200) is determined relative to the substrate of the semiconductor device (e.g., substrate 202) in the y-direction (the vertical direction) when the substrate is positioned in the lowest plane of the semiconductor device in the y-direction. The same notion for describing spatial relationship is applied throughout the present disclosure.

3D memory device 200 can be part of a non-monolithic 3D memory device, in which components (e.g., the peripheral device and array device) can be formed separately on different substrates and then bonded in a face-to-face manner. In some embodiments, the array device substrate (e.g., substrate 202) remains as the substrate of the bonded non-monolithic 3D memory device, and the peripheral device (e.g., any suitable digital, analog, and/or mixed-signal peripheral circuits used for facilitating the operation of 3D memory device 200, such as page buffers, decoders, and latches; not shown) is flipped and faces down towards 3D memory device 200 for hybrid bonding. It is understood that in some embodiments, 3D memory device 200 is flipped and faces down towards the peripheral device (not shown) for hybrid bonding, so that in the bonded non-monolithic 3D memory device, the array device is above the peripheral device. The array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned array device substrate 202.

Nevertheless, 3D memory device 200 can be part of a non-monolithic 3D memory device regardless of whether 3D memory device 200 is above or below the peripheral device in the non-monolithic 3D memory device. For ease of reference, FIG. 2 depicts a state of 3D memory device 200 in which substrate 202 (the array device substrate) is positioned below the array device in the y-direction, regardless of whether substrate 202 is the substrate of non-monolithic 3D memory device or a thinned substrate on which the BEOL interconnects of the non-monolithic 3D memory device are formed.

In some embodiments, 3D memory device 200 is a NAND Flash memory device in which memory cells are provided in the form of an array of NAND strings 204 extending vertically above substrate 202. The array device can include a plurality of NAND strings 204 that extend through a plurality of conductor layer 206 and dielectric layer 208 pairs. The plurality of conductor/dielectric layer pairs are also referred to herein as an "alternating conductor/dielectric stack" 210. The number of the conductor/dielectric layer pairs in alternating conductor/dielectric stack 210 (e.g., 32, 64, or 96) can set the number of memory cells in 3D memory device 200. Conductor layers 206 and dielectric layers 208 in alternating conductor/dielectric stack 210 alternate in the vertical direction. In other words, except the ones at the top or bottom of alternating conductor/dielectric stack 210, each conductor layer 206 can be adjoined by two dielectric layers 208 on both sides, and each dielectric layer 208 can be adjoined by two conductor layers 206 on both sides. Conductor layers 206 can each have the same thickness or have different thicknesses. Similarly, dielectric layers 208 can each have the same thickness or have different thicknesses. Conductor layers 206 can include conductor materials including, but not limited to, tungsten (W), cobalt (Co), copper (Cu), aluminum (Al), polycrystalline silicon (polysilicon), doped silicon, silicides, or any combination thereof. Dielectric layers 208 can include dielectric materials including, but not limited to, silicon oxide, silicon nitride, silicon oxynitride, or any combination thereof. In some embodiments, conductor layers 206 include metal layers, such as W, and dielectric layers 208 include silicon oxide.

As shown in FIG. 2, at least on one side in the lateral direction, alternating conductor/dielectric stack 210 can include a staircase structure 212. Each "level" 213 of staircase structure 212 can include one or more conductor/dielectric layer pairs, each including conductor layer 206 and dielectric layer 208. The top layer in each level 213 of staircase structure 212 can be conductor layer 206 for interconnection in the vertical direction. In some embodiments, each two adjacent levels 213 of staircase structure 212 are offset by a nominally same distance in the vertical direction and a nominally same distance in the lateral direction. For each two adjacent levels 213 of staircase structure 212, the first level (and conductor layer and dielectric layer therein) that is closer to substrate 202 can extend laterally further than the second level (and conductor layer and dielectric layer therein), thereby forming a "landing area" on the first level for interconnection in the vertical direction.

As shown in FIG. 2, each NAND string 204 can include a channel structure 218 extending through alternating conductor/dielectric stack 210. Channel structure 218 can include a channel hole filled with semiconductor materials (e.g., as a semiconductor channel 220) and dielectric materials (e.g., as a memory film 222). In some embodiments, semiconductor channel 220 includes silicon, such as amorphous silicon, polysilicon, or single crystalline silicon. In some embodiments, memory film 222 is a composite layer including a tunneling layer, a storage layer (also known as "charge trap/storage layer"), and a blocking layer. Each NAND string 204 can have a cylinder shape (e.g., a pillar shape). Semiconductor channel 220, the tunneling layer, the storage layer, and the blocking layer are arranged along a direction from the center toward the outer surface of the pillar in this order, according to some embodiments. The tunneling layer can include silicon oxide, silicon nitride, or any combination thereof. The storage layer can include silicon nitride, silicon oxynitride, silicon, or any combination thereof. The blocking layer can include silicon oxide, silicon nitride, high dielectric constant (high-k) dielectrics, or any combination thereof.

In some embodiments, NAND strings 204 include a plurality of control gates (each being part of a word line) for NAND strings 204. Conductor layer 206 in alternating conductor/dielectric stack 210 can function as a control gate for memory cells of NAND string 204. Conductor layer 206 can include multiple control gates for multiple NAND strings 204 and can extend laterally as a word line ending in staircase structure 212.

In some embodiments, NAND string 204 incudes an epitaxial plug 224 and an etch stop plug 226 at a respective end in the vertical direction. Each of epitaxial plug 224 and etch stop plug 226 can be in contact with a respective end of channel structure 218. Epitaxial plug 224 can include a semiconductor material, such as silicon, that is epitaxially grown from substrate 202. Epitaxial plug 224 can function as the channel controlled by a source selective gate of NAND string 204. Etch stop plug 226 can be at the upper end of NAND string 204 and in contact with channel structure 218 (e.g., on the upper end of channel structure 218). As used herein, the "upper end" of a component (e.g., NAND string 204) is the end further away from substrate 202 in the y-direction, and the "lower end" of the component (e.g., NAND string 204) is the end closer to substrate 202 in the y-direction when substrate 202 is positioned in the lowest plane of 3D memory device 200.

Etch stop plug 226 can include semiconductor materials (e.g., polysilicon) or conductor materials (e.g., metals). In some embodiments, etch stop plug 226 includes an opening filled with titanium/titanium nitride (Ti/TiN as a barrier layer) and W (as a conductor). By covering the upper end of channel structure 218 during the fabrication of 3D memory device 200, etch stop plug 226 can function as an etch stop layer to prevent etching of dielectrics filled in channel structure 218, such as silicon oxide and silicon nitride. In some embodiments, etch stop plug 226 functions as the drain of NAND string 204.

In some embodiments, the array device further includes slit structures 228. Each slit structure 228 can extend vertically through alternating conductor/dielectric stack 210. Slit structure 228 can also extend laterally to separate alternating conductor/dielectric stack 210 into multiple blocks. Slit structure 228 can include a slit filled with conductor materials including, but not limited to, W, Co, Cu, Al, silicides, or any combination thereof. Slit structure 228 can further include a dielectric layer with any suitable dielectric materials between the filled conductor materials and alternating conductor/dielectric stack 210 to electrically insulate the filled conductor materials from surrounding conductor layers 206 in alternating conductor/dielectric stack 210. As a result, slit structures 228 can separate 3D memory device 200 into multiple memory blocks and/or memory fingers (e.g., as shown in FIGS. 1A-1C in the plan view).

In some embodiments, slit structure 228 functions as the source contact for NAND strings 204 in the same memory block or the same memory finger that share the same array common source. Slit structure 228 can thus be referred to as a "common source contact" of multiple NAND strings 204. In some embodiments, substrate 202 includes a doped region 230 (including p-type or n-type dopants at a desired doping level), and the lower end of slit structure 228 is in contact with doped region 230 of substrate 202. Slit structure 228 thus can electrically connect to NAND strings 204 by doped region 230.

As shown in FIG. 2, alternating conductor/dielectric stack 210 can be a portion of an alternating layer stack 216, which can also include an alternating dielectric stack 214 on substrate 202. Alternating dielectric stack 214 can include a plurality of dielectric layer pairs, for example, an alternating stack of a first dielectric layer 232 and a second dielectric layer 234 that is different from first dielectric layer 232. In some embodiments, first dielectric layer 232 and second dielectric layer 234 each includes silicon nitride and silicon oxide. First dielectric layers 232 in alternating dielectric stack 214 can be the same as dielectric layers 208 in alternating conductor/dielectric stack 210. In some embodiments, the number of dielectric layer pairs in alternating dielectric stack 214 is the same as the number of conductor/dielectric layer pairs in alternating conductor/dielectric stack 210.

In some embodiments, 3D memory device 200 includes a barrier structure 235 extending vertically through alternating layer stack 216. Barrier structure 235 can separate laterally alternating layer stack 216 into alternating conductor/dielectric stack 210 and alternating dielectric stack 214. That is, barrier structure 235 can become the boundary between alternating conductor/dielectric stack 210 and alternating dielectric stack 214. Alternating dielectric stack 214 can be enclosed laterally by at least barrier structure 235. In some embodiments, barrier structure 235 is in a closed shape (e.g., a rectangle, a square, a circle, etc.) in the plan view to completely enclose alternating dielectric stack 214. For example, as shown in FIG. 1A, barrier structure 124 is in a rectangle shape in the plan view to completely enclose the alternating dielectric stack in TAC region 120. In some embodiments, barrier structure 235 is not in a closed shape in the plan view, but can enclose alternating dielectric stack 214 in conjunction with one or more edges of alternating layer stack 216. For example, as shown in FIGS. 1B and 1C, barrier structure 124, in conjunction with the edge(s) of the 3D memory device, encloses the alternating dielectric stack in TAC region 120.

As shown in FIG. 2, 3D memory device 200 further includes TACs 236 each extending vertically through alternating dielectric stack 214. TACs 236 can be formed only inside the area enclosed laterally by at least barrier structure 235, which includes a plurality of dielectric layer pairs. That is, TACs 236 can extend vertically through dielectric layers (e.g., first dielectric layers 232 and second dielectric layers 234), but not through any conductor layers (e.g., conductor layers 206). Each TAC 236 can extend through the entire thickness of alternating dielectric stack 214, (e.g., all the dielectric layer pairs in the vertical direction). In some embodiments, TAC 236 further extends through at least part of substrate 202.

TACs 236 can carry electrical signals from and/or to 3D memory device 200, such as part of the power bus, with shorten interconnect routing. In some embodiments, TACs 236 can provide electrical connections between 3D memory device 200 and the peripheral device (e.g., on a CMOS chip; not shown) and/or between BEOL interconnects (not shown) and the peripheral device. TACs 236 can also provide mechanical support to alternating layer stack 216. Each TAC 236 can include a vertical opening through alternating dielectric stack 214 and that is filled with conductor materials, including, but not limited to, W, Co, Cu, Al, doped silicon, silicides, or any combination thereof. In some embodiments, as TACs 236 are formed in alternating dielectric stack 214 (surrounding by dielectric layers), an additional dielectric layer between TAC 236 and alternating dielectric stack 214 is not needed for insulation purposes.

In some embodiments, 3D memory device 200 includes a plurality of local contacts in contact with the various memory array structures disclosed herein, such as NAND strings 204, slit structures 228, and word lines 206 in staircase structure 212. The contacts are referred to herein as "local contacts" as they are in contact with the memory array structures directly. As shown in FIG. 2, local contacts can include NAND string contacts 238, slit structure contacts 240, and word line contacts 242. TACs 236 can also be considered as local contacts in the present disclosure. As used herein, the term "contact" can broadly include any suitable types of interconnects, including vertical interconnect accesses (e.g., vias) and lateral lines (e.g., interconnect lines).

In some embodiments, an end (e.g., the upper end) of each local contact is flush with one another, e.g., on the top surface of a dielectric layer in which the local contacts are formed. Another end (e.g., the lower end) of each local contact can be in contact with the respective memory array structure. For example, the lower end of NAND string contact 238 can be in contact with etch stop plug 226 of NAND string 204, and the lower end of slit structure contact 240 can be in contact with the upper end of slit structure 228. The lower end of each word line contact 242 can be in contact with top conductor layer 206 (word line) in a respective level of staircase structure 212. Each local contact can include an opening (e.g., a via hole or a trench) filled with conductor materials including, but not limited to, W, Co, Cu, Al, silicides, or any combination thereof. Some or all of the local contacts can be formed simultaneously in a single contact forming process as described below in detail.

As shown in FIG. 2, in addition to the local contacts, 3D memory device 200 further includes a contact layer 244 and an interconnect conductor layer 246 as part of its interconnect structures. Contact layer 244 can include a dielectric layer and a plurality of contacts 248 (e.g., vias) in the dielectric layer. Interconnect conductor layer 246 can be formed on contact layer 244 and can include a dielectric layer and a plurality of contacts 250 (e.g., interconnect lines) in the dielectric layer. The local contacts, contacts 248 in contact layer 244, and contacts 250 in interconnect conductor layer 246 can be collectively referred to herein as the interconnect structures of 3D memory device 200.

In some embodiments, an end (e.g., the upper end) of each contact 248 in contact layer 244 is flush with one another, e.g., on the top surface of the dielectric layer in which contacts 248 are formed; another end (e.g., the lower end) of each contact 248 in contact layer 244 is flush with one another, e.g., on the bottom surface of the dielectric layer in contact layer 244. The lower end of each contact 248 can be in contact with the upper end of a respective local contact. Each contact 248 can include an opening (e.g., a via hole) filled with conductor materials including, but not limited to, W, Co, Cu, Al, silicides, or any combination thereof. All contacts 248 can be formed simultaneously in a single contact forming process as described below in detail.

In some embodiments, an end (e.g., the upper end) of each contact 250 in interconnect conductor layer 246 is flush with one another, e.g., on the top upper surface of the dielectric layer in which contacts 250 are formed; another end (e.g., the lower end) of each contact 250 in interconnect conductor layer 246 is flush with one another, e.g., on the bottom surface of the dielectric layer in interconnect conductor layer 246. The lower end of each contact 250 can be in contact with the upper end of a respective contact 248. Each contact 250 can include an opening (e.g., a trench) filled with conductor materials including, but not limited to, W, Co, Cu, Al, silicides, or any combination thereof. All contacts 250 can be formed simultaneously in a single contact formation process as described below in detail.

In some embodiments, contacts 250 in interconnect conductor layer 246 include bit lines 252 electrically connected to NAND strings 204, respectively, by corresponding contact 248 and NAND string contact 238 to individually address corresponding NAND string 204. Contacts 250 can further include source lines electrically connected to slit structures 228 (source contacts), interconnect lines electrically connected to TACs 236, and interconnect lines electrically connected to word lines 206 in staircase structure 212. It is to be understood that the number of interconnect layers in 3D memory device 200 is not limited by the example in FIG. 2. Additional interconnect layer(s) with contacts can be formed to provide desired interconnect structures of 3D memory device 200.

Figure 3:
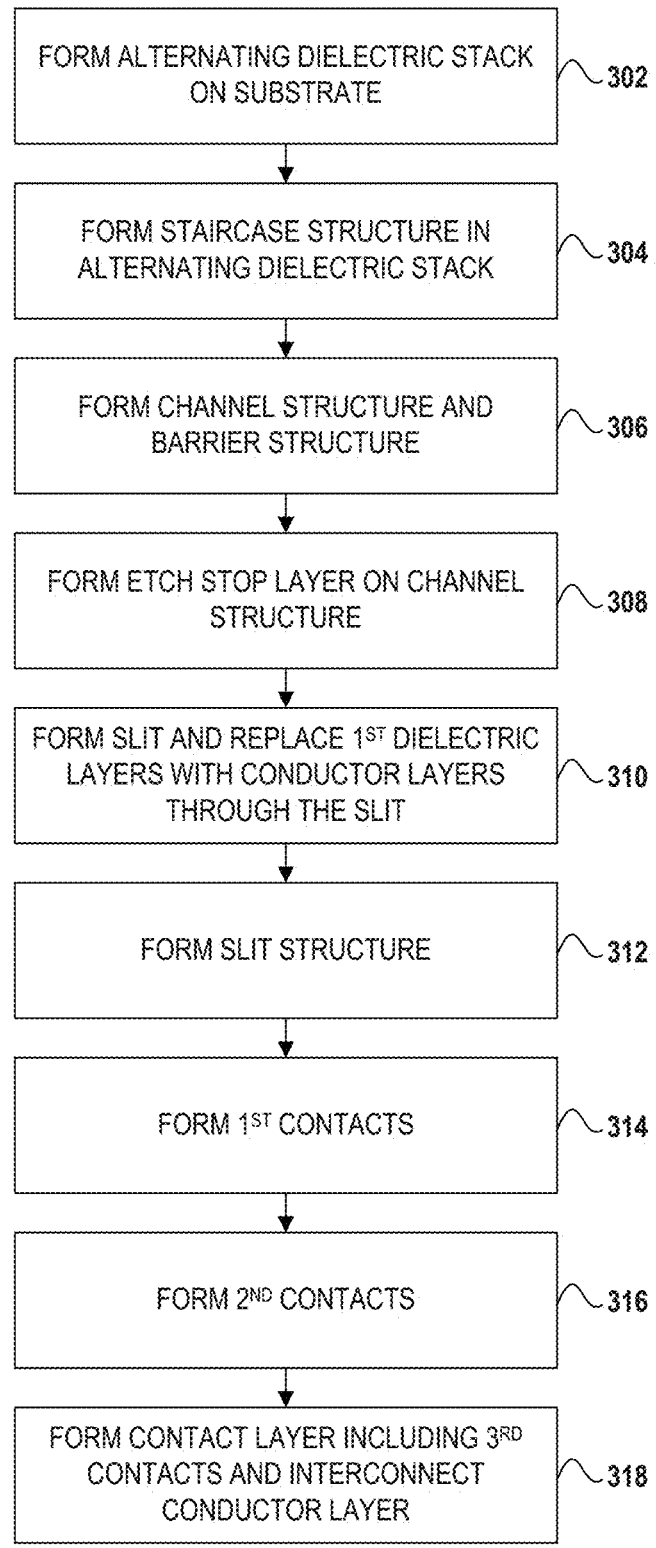
FIG. 3 is a flowchart of an exemplary method for forming a 3D memory device, according to some embodiments of the present disclosure.

FIG. 3 is a flowchart of an exemplary method 300 for forming a 3D memory device, according to some embodiments of the present disclosure. FIGS. 4-10 illustrate an exemplary fabrication process for forming a 3D memory device, according to some embodiments of the present disclosure. An example of the 3D memory device depicted in FIGS. 3-10 is 3D memory device 200 depicted in FIG. 2. It should be understood that the operations shown in method 300 are not exhaustive and that other operations can be performed as well before, after, or between any of the illustrated operations.

Figure 4:
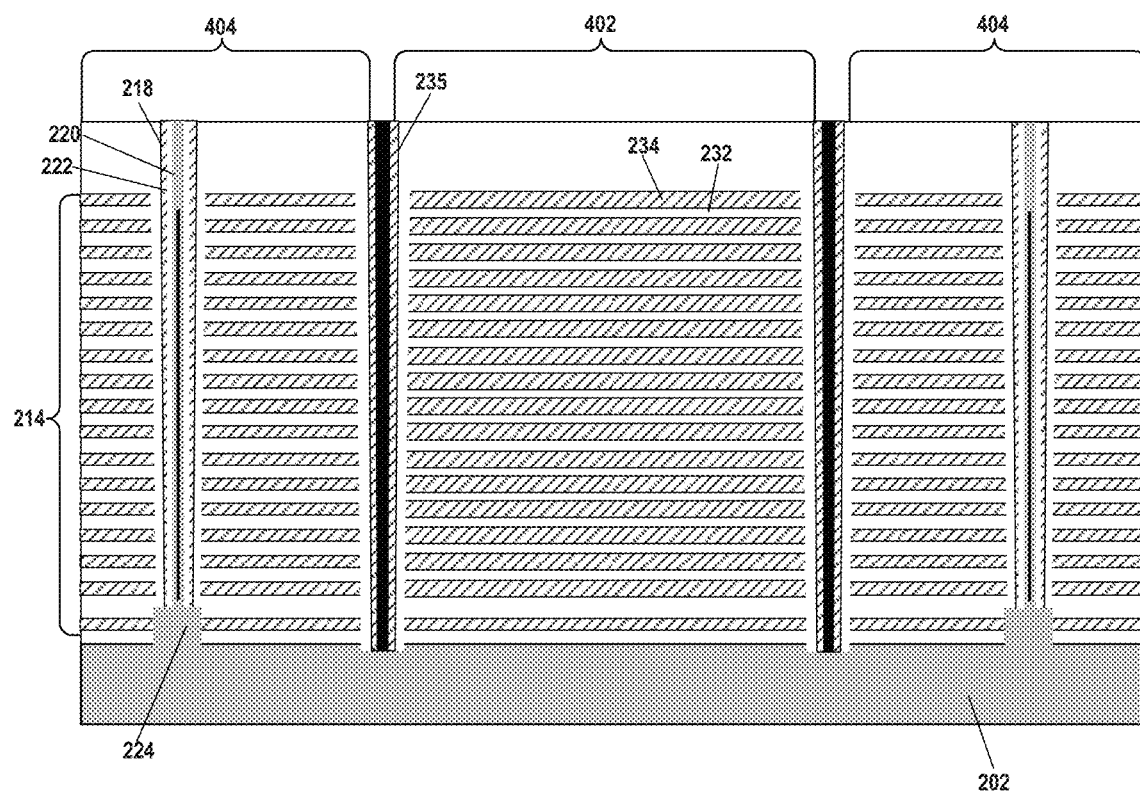
FIGS. 4-10 illustrate an exemplary fabrication process for forming a 3D memory device, according to some embodiments of the present disclosure.

Referring to FIG. 3, method 300 starts at operation 302, in which an alternating dielectric stack is formed on a substrate. The substrate can be a silicon substrate. As illustrated in FIG. 4, alternating dielectric stack 214 is formed on substrate 202. A plurality of first dielectric layer 232 and second dielectric layer 234 pairs can be formed on substrate 202 to form alternating dielectric stack 214. In some embodiments, each dielectric layer pair includes a layer of silicon nitride and a layer of silicon oxide. Alternating dielectric stack 214 can be formed by one or more thin film deposition processes including, but not limited to, CVD, PVD, ALD, or any combination thereof.

Method 300 proceeds to operation 304, as illustrated in FIG. 3, in which a staircase structure is formed in the alternating dielectric stack. In some embodiments, a trim-etch process can be performed on at least one side (in the lateral direction) of alternating dielectric stack 214 to form the staircase structure with multiple levels. Each level can include one or more dielectric layer pairs with alternating first dielectric layer 232 and second dielectric layer 234.

Method 300 proceeds to operation 306, as illustrated in FIG. 3, in which a channel structure and a barrier structure are formed. Each of the channel structure and barrier structure can extend vertically through the alternating dielectric stack. As illustrated in FIG. 4, channel structure 218 is formed through alternating dielectric stack 214. In some embodiments, epitaxial plug 224 is formed by epitaxially growth of single crystalline silicon from substrate 202. Channel structure 218 can be formed on epitaxial plug 224.

In some embodiments, fabrication processes to form channel structure 218 further include forming a channel hole that extends vertically through alternating dielectric stack 214 by, for example, wet etching and/or dry etching. In some embodiments, fabrication processes to form channel structure 218 further include forming semiconductor channel 220 and memory film 222 between semiconductor channel 220 and the dielectric layer pairs in alternating dielectric stack 214. Semiconductor channel 220 can include semiconductor materials, such as polysilicon. Memory film 222 can be a composite dielectric layer, such as a combination of a tunneling layer, a storage layer, and a blocking layer.

The tunneling layer can include dielectric materials including, but not limited to, silicon oxide, silicon nitride, silicon oxynitride, or any combination thereof. Electrons or holes from the semiconductor channel can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer, such as a an aluminum oxide ($Al_2O_3$) layer. Semiconductor channel 220 and memory film 222 can be formed by one or more thin film deposition processes, such as ALD, CVD, PVD, any other suitable processes, or any combination thereof.

In some embodiments, fabrication processes to form barrier structure 235 are similarly and simultaneously performed as the fabrication processes to form channel structure 218, thereby reducing fabrication complexity and cost. After the openings of channel structure 218 and barrier structure 235 are formed through alternating dielectric stack 214, one or more thin film deposition processes can be performed to simultaneously fill the openings of channel structure 218 and barrier structure 235. As a result, barrier structure 235 can include one or more of the materials filling channel structure 218, such as polysilicon, silicon oxide, silicon nitride, and high-k dielectrics. In some embodiments, barrier structure 235 is filled with silicon oxide and silicon nitride. It is understood that in some embodiments, channel structure 218 and barrier structure 235 are formed in different fabrication steps so that barrier structure 235 can be filled with materials different from the materials filling channel structure 218. By forming barrier structure 235, alternating dielectric stack 214 can be separated into two areas: an inside area 402 enclosed laterally by at least barrier structure 235 (in conjunction with the edge(s) of alternating dielectric stack 214 in some embodiments) and an outside area 404 in which channel structures 218 are formed.

In some embodiments, dummy channel structures (not shown in FIGS. 4-10; e.g., dummy channel structures 122 in FIGS. 1A-1B) are formed simultaneously with channel structures 218. The dummy channel structures can extend vertically through the alternating layer stack and can be filled with the same materials as those in channel structures 218. Different from channel structures 218, contacts are not formed on the dummy channel structures to provide electrical connections with other components of the 3D memory device. Thus, the dummy channel structures cannot be used for forming memory cells in the 3D memory device.

Figure 5:
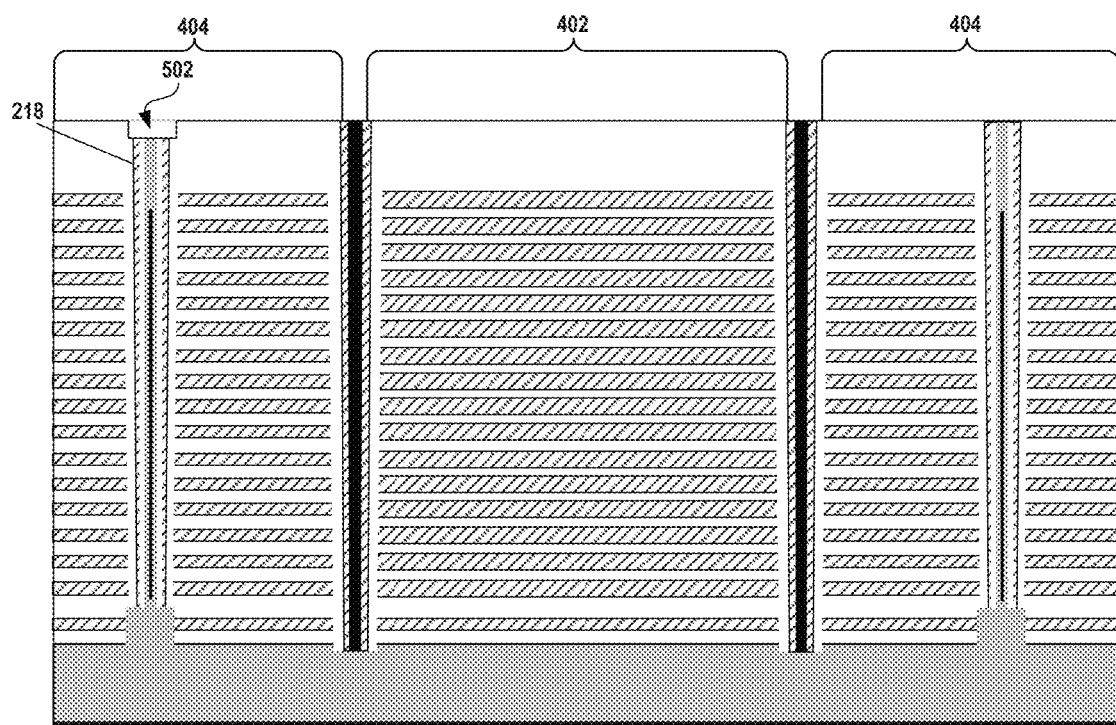
Figure 6:
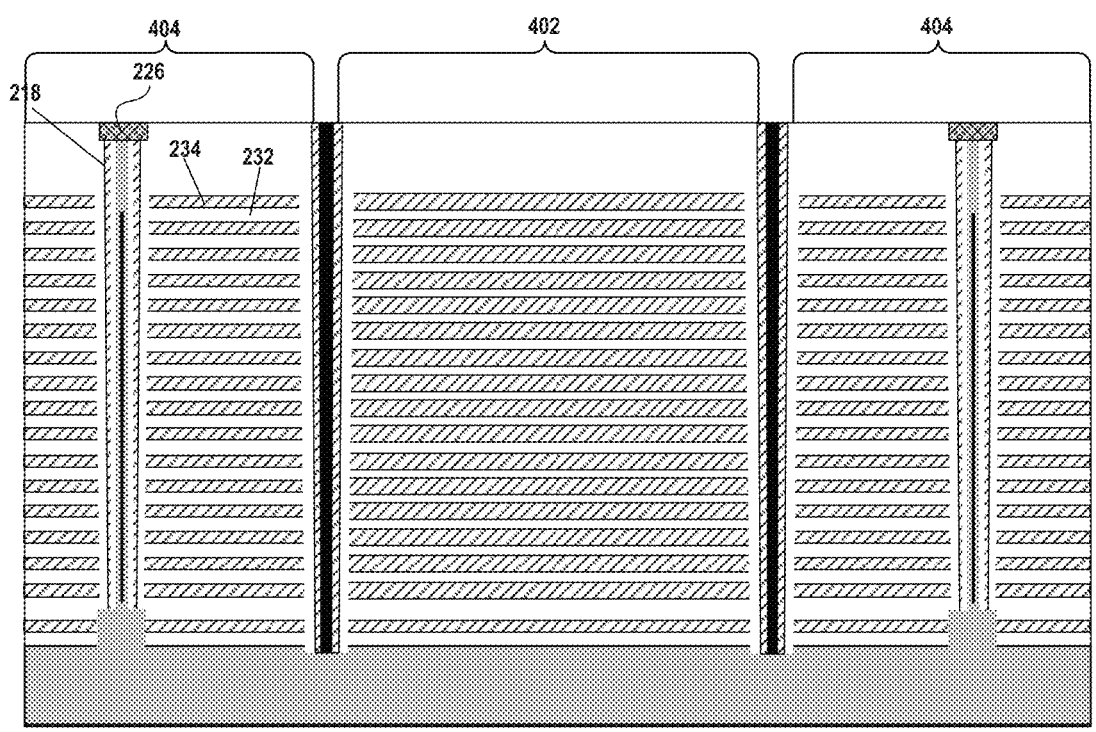

Method 300 proceeds to operation 308, as illustrated in FIG. 3, in which an etch stop layer is formed on the channel structure. As illustrated in FIG. 5, a recess 502 is formed on each channel structure 218. Recess 502 can be formed by wet etching and/or dry etching of a dielectric layer (e.g., a silicon oxide layer) and a top portion of channel structure 218. As illustrated in FIG. 6, etch stop layer 226 (as referred to herein as "etch stop plug" for each channel structure 218) is formed on channel structures 218 by filling recess 502 using one or more thin film deposition processes, such as ALD, CVD, PVD, any other suitable processes, or any combination thereof. In some embodiments, polysilicon is deposited to fill recess 502, followed by a CMP process to remove excess polysilicon and planarize the top surface of the top dielectric layer. In some embodiments, a composite metal layer, such as Ti/TiN/W is deposited to fill recess 502, followed by a CMP process to remove excess metal layer and planarize the top surface of the top dielectric layer.

Method 300 proceeds to operation 310, as illustrated in FIG. 3, in which a slit is formed, and first dielectric layers in a portion of the alternating dielectric stack are replaced with conductor layers through the slit. For example, a slit of slit structure 228 (shown in FIG. 7) can be first formed by wet etching and/or dry etching of dielectrics (e.g., silicon oxide and silicon nitride) through alternating dielectric stack 214 in outside area 404 (e.g., shown in FIG. 6). In some embodiments, doped regions 230 are then formed in substrate 202 under each slit by, for example, ion implantation and/or thermal diffusion through the slits. It is understood that doped regions 230 can be formed in an earlier fabrication stage, for example, prior to the formation of the slits, according to some embodiments.

Figure 7:
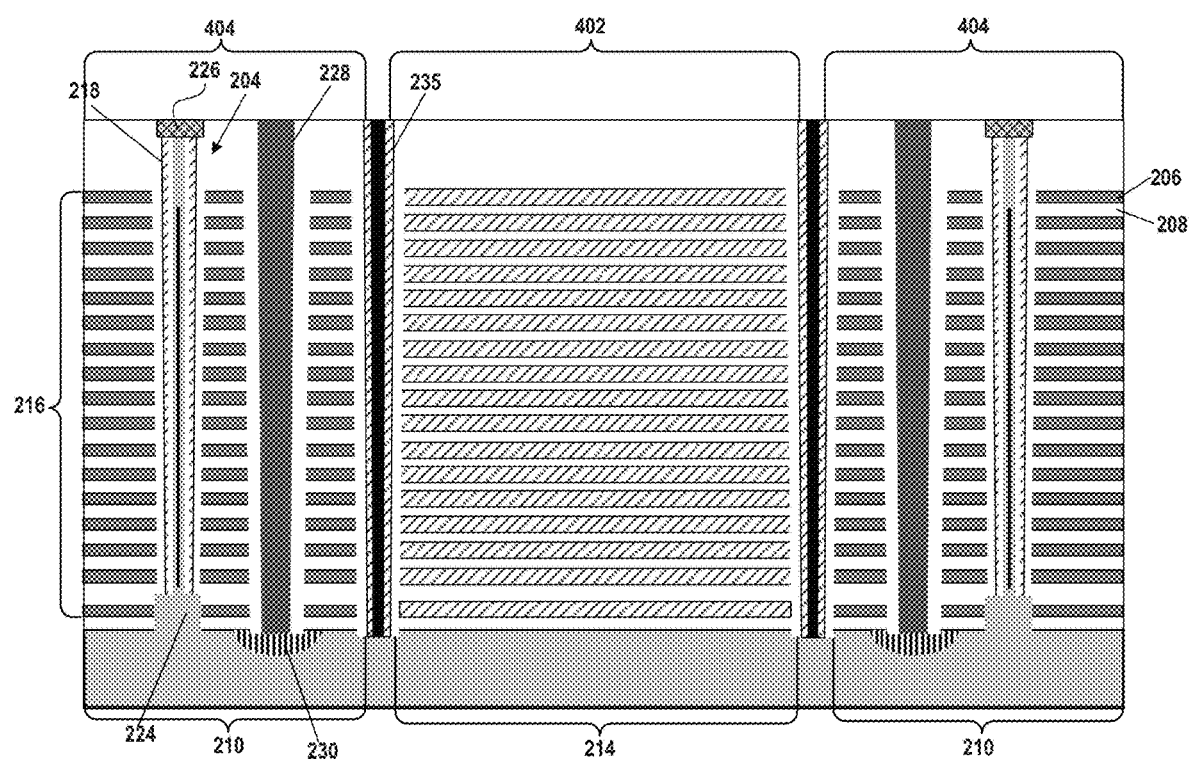

In some embodiments, the formed slits are used for the gate replacement process (also known as the "word line replacement" process) that replaces, in outside area 404 of alternating dielectric stack 214, second dielectric layers 234 (shown in FIG. 6; e.g., silicon nitride) with conductor layers 206 (shown in FIG. 7; e.g., W). As illustrated in FIG. 7, the gate replacement occurs only in outside area 404 of alternating dielectric stack 214, but not inside area 402, due to the formation of barrier structure 235. Barrier structure 235 can prevent the etching of second dielectric layers 234 (e.g., silicon nitride) in inside area 402 of alternating dielectric stack 214 because barrier structure 235 is filled materials that cannot be etched by the etching step of the gate replacement process. As a result, after the gate replacement process, alternating dielectric stack 214 in FIGS. 1-6 becomes alternating layer stack 216 including alternating conductor/dielectric stack 210 in outside area 404, and alternating dielectric stack 214 in inside area 402. The replacement of second dielectric layers 234 with conductor layers 206 can be performed by wet etching second dielectric layers 234 (e.g., silicon nitride) selective to first dielectric layers 232 (e.g., silicon oxide) and filling the structure with conductor layers 206 (e.g., W). Conductor layers 206 can be filled by PVD, CVD, ALD, any other suitable process, or any combination thereof. Conductor layers 206 can include conductor materials including, but not limited to, W, Co, Cu, Al, polysilicon, silicides, or any combination thereof. After gate replacement, NAND strings 204 can be formed, each of which can include channel structure 218, epitaxial plug 224, etch stop plug 226, and multiple control gates and selective gates (e.g., surrounding conductor layers 206).

Method 300 proceeds to operation 312, as illustrated in FIG. 3, in which slit structures are formed. As illustrated in FIG. 7, slit structures 228 can be formed by filling (e.g., depositing) conductor materials into the slits by PVD, CVD, ALD, any other suitable process, or any combination thereof. Slit structures 228 can include conductor materials including, but not limited to, W, Co, Cu, Al, polysilicon, silicides, or any combination thereof. In some embodiments, a dielectric layer (e.g., a silicon oxide layer) is formed first between the conductor materials of slit structure 228 and conductor layers 206 surrounding slit structure 228 in alternating conductor/dielectric stack 210 for insulation purposes. The lower end of slit structure 228 can be in contact with doped region 230. In some embodiments, slit structure 228 functions as a source contact electrically connected to NAND string 204 by doped region 230 of substrate 202. As shown in FIG. 7, the upper end of each slit structure 228 is flush with the upper end of each etch stop plug 226 (e.g., on the top surface of the dielectric layer in which etch stop plugs 226 and slit structures 228 are formed), according to some embodiments.

Figure 8:
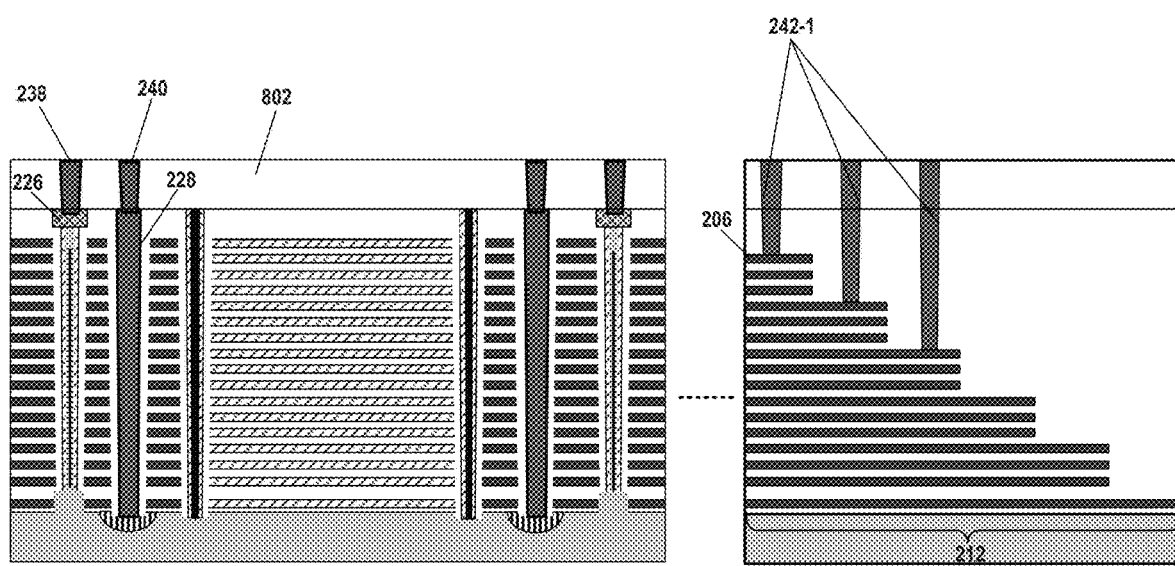

Method 300 proceeds to operation 314, as illustrated in FIG. 3, in which a plurality of first contacts (e.g., local contacts) are formed. As illustrated in FIG. 8, a dielectric layer 802 can be formed by one or more thin film deposition processes, such as ALD, CVD, PVD, any other suitable processes, or any combination thereof. Dielectric layer 802 can include dielectric materials, including, but not limited to, silicon oxide, silicon nitride, silicon oxynitride, or any combination thereof. Local contacts (including NAND string contacts 238, gate slit contacts 240, and upper word line contacts 242-1) can be formed through dielectric layer 802 by first etching vertical openings (e.g., by wet etching and/or dry etching), followed by filling the openings with conductor materials using ALD, CVD, PVD, any other suitable processes, or any combination thereof. The conductor materials used to fill the local contacts can include, but are not limited to, W, Co, Cu, Al, polysilicon, silicides, or any combination thereof. In some embodiments, other conductor materials are filled in the openings to function as a barrier layer, an adhesion layer, and/or a seed layer. Etching of dielectric layers to form the openings of local contacts can be controlled by etch stop at a different material. For example, for NAND string contacts 238, etch stop layer 226 filled with semiconductor and/or metal materials can prevent further etching into channel structure 218. As to gate slit contacts 240 and upper word line contacts 242-1, etching of dielectric layers can be stopped when reaching to the upper ends of slit structures 228 and word lines 206.

As shown in FIG. 8, NAND string contacts 238, slit structure contacts 240, and one or more upper word line contacts 242-1 are close to the top surface of dielectric layer 802 (i.e., having smaller lengths compared with other word line contacts 242). The lower end of NAND string contact 238 can be in contact with the upper end of etch stop plug 226, and the lower end of slit structure contact 240 can be in contact with the upper end of slit structure 228. FIG. 8 also illustrates staircase structure 212 with conductor layers 206 in each level after gate replacement. The lower end of each upper word line contacts 242-1 can be in contact with corresponding conductor layer 206 (word line) in one level of staircase structure 212.

Local contacts (including NAND string contacts 238, slit structure contacts 240, and upper word line contacts 242-1)

can be simultaneously formed in the same contact forming process. It is understood that a contact forming process can include multiple processes, for example, photolithography, etching, thin film deposition, and CMP. In some embodiments, each process in the contact forming process needs to be performed only once for all of NAND string contacts 238, slit structure contacts 240, and upper word line contacts 242-1. For example, a single lithography process can be performed to pattern the masks for all the openings of NAND string contacts 238, slit structure contacts 240, and upper word line contacts 242-1; a single etching process can be performed to etch all the openings of NAND string contacts 238, slit structure contacts 240, and upper word line contacts 242-1; a single deposition process can be performed to fill all the openings of NAND string contacts 238, slit structure contacts 240, and upper word line contacts 242-1 with the same conductor materials.

Figure 9:
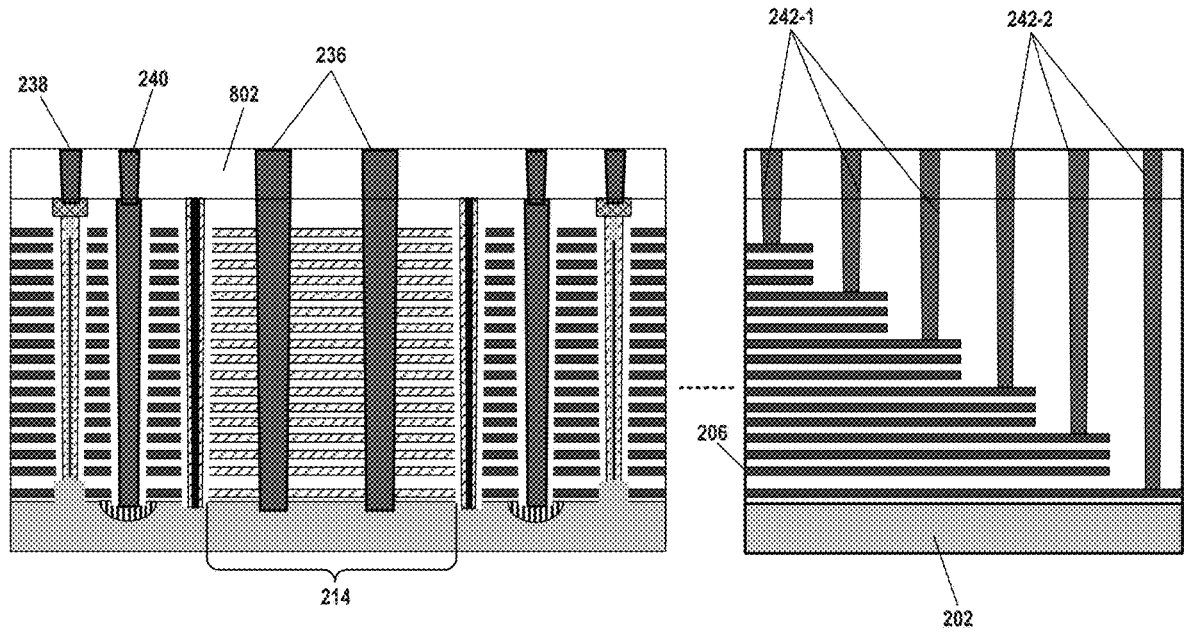

As illustrated in FIG. 9, in some embodiments, after forming the first set of local contacts (including NAND string contacts 238, slit structure contacts 240, and upper word line contacts 242-1 as shown in FIG. 8), a second set of local contacts are formed, including TACs 236 and lower word line contacts 242-2 that are close to substrate 202 (i.e., having greater lengths compared with upper word line contacts 242-1). TACs 236 and lower word line contacts 242-2 can be formed through dielectric layer 802 by first etching vertical openings (e.g., by wet etching and/or dry etching), followed by filling the openings with conductor materials using ALD, CVD, PVD, any other suitable processes, or any combination thereof. The conductor materials used for filling the local contacts can include, but are not limited to, W, Co, Cu, Al, polysilicon, silicides, or any combination thereof. In some embodiments, other conductor materials are also used to fill the openings to function as a barrier layer, an adhesion layer, and/or a seed layer.

TACs 236 can be formed by etching through the entire thickness of alternating dielectric stack 214. Because alternating dielectric stack 214 includes alternating layers of dielectrics, such as silicon oxide and silicon nitride, the openings of TACs 236 can be formed by deep etching of dielectric materials (e.g., by deep reactive-ion etching (DRIE) process or any other suitable anisotropic etch process). In some embodiments, although TACs 236 are formed after the gate replacement, by reserving an area of alternating dielectric stack 214 that is not affected by the gate replacement process (not turned into alternating conductor/dielectric stack 210), TACs 236 are still formed through dielectric layers (without passing through any conductor layers), which simplifies the fabrication process and reduces the cost. Moreover, as TACs 236 can be relatively easily formed even after the gate replacement, TACs 236 can be formed together with some or all of other local contacts in the same contact forming process to further reduce fabrication complexity and cost.

In some embodiments, the lower end of TACs 236 can be in contact with substrate 202. As shown in FIG. 9, TACs 236 can extend further through at least part of substrate 202. The lower end of each lower word line contacts 242-2 can be in contact with corresponding conductor layer 206 (word line) in one level of staircase structure 212. The upper ends of all the local contacts (including both the first and second sets of local contacts formed in FIGS. 8 and 9) can be flush with one another at the top surface of dielectric layer 802. The second set of local contacts (including TACs 236 and upper word line contacts 242-2) can be simultaneously formed in the same contact forming process after the formation of the first set of local contacts. That is, all the local contacts (including both the first and second sets of local contacts) can be formed in two contact forming processes as illustrated in FIGS. 8 and 9.

It is understood that in some embodiments, all the local contacts (including both the first and second sets of local contacts) can be simultaneously formed in a single contact forming process. That is, the two contact forming processes illustrated in FIGS. 8 and 9 can be combined into a single contact forming process. In some embodiments, each process in the contact forming process needs to be performed once for all of NAND string contacts 238, slit structure contacts 240, TACs 236, upper word line contacts 242-1, and lower word line contacts 242-2. For example, a single lithography process can be performed to pattern the masks for all the openings of NAND string contacts 238, slit structure contacts 240, TACs 236, and both upper and lower word line contacts 242-1 and 242-2; a single etching process can be performed to etch all the openings of NAND string contacts 238, slit structure contacts 240, TACs 236, and both upper and lower word line contacts 242-1 and 242-2; a single deposition process can be performed to fill all the openings of NAND string contacts 238, slit structure contacts 240, TACs 236, and both upper and lower word line contacts 242-1 and 242-2 with the same conductor materials.

Figure 10:
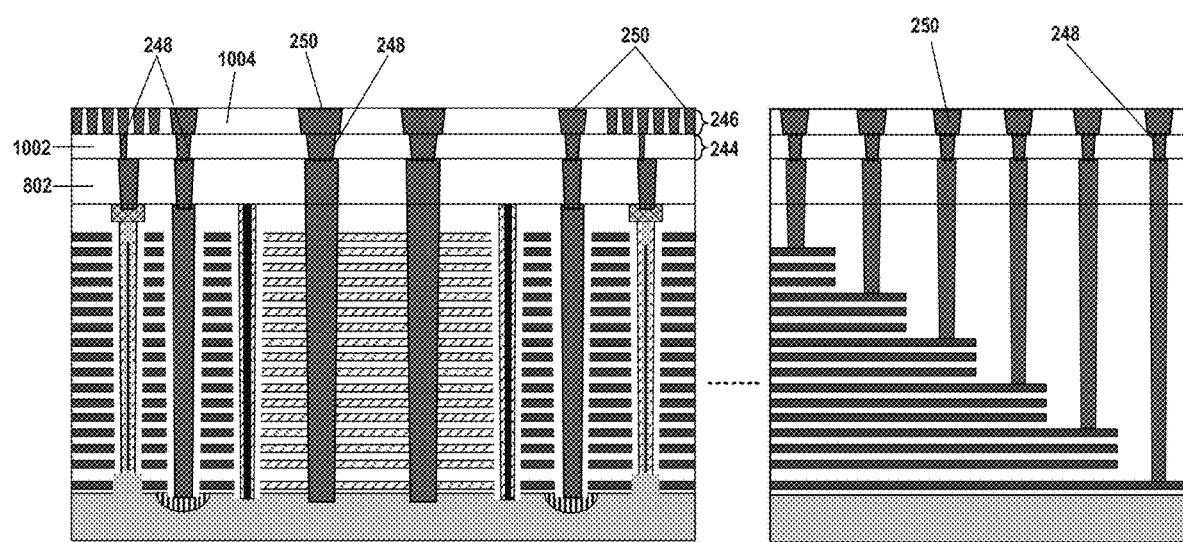

Method 300 proceeds to operation 316, as illustrated in FIG. 3, in which a plurality of second contacts in a contact layer are formed. As illustrated in FIG. 10, contact layer 244 (including a dielectric layer 1002 and contacts 248) is formed above dielectric layer 802. The upper end of each contact 248 can be flush with one another at the top surface of dielectric layer 1002, and the lower end of each contact 248 can be flush with one another at the bottom surface of dielectric layer 1002. Dielectric layer 1002 can be formed by one or more thin film deposition processes, such as ALD, CVD, PVD, any other suitable processes, or any combination thereof. Dielectric layer 1002 can include dielectric materials, including, but not limited to, silicon oxide, silicon nitride, silicon oxynitride, or any combination thereof. Contacts 248 can be formed through dielectric layer 1002 by first etching vertical openings (e.g., by wet etching and/or dry etching), followed by filling the openings with conductor materials using ALD, CVD, PVD, any other suitable processes, or any combination thereof. The conductor materials used to fill contacts 248 can include, but are not limited to, W, Co, Cu, Al, polysilicon, silicides, or any combination thereof. In some embodiments, other conductor materials are used to fill the openings to function as a barrier layer, an adhesion layer, and/or a seed layer.

As shown in FIG. 10, the lower end of each contact 248 can be in contact with the upper end of a corresponding local contact, for example, NAND string contact 238, slit structure contact 240, TAC 236, or word line contact 242. In some embodiments, all contacts 248 in contact layer 244 can be simultaneously formed in the same contact forming process. In some embodiments, each contact 248 is a via, and contact layer 244 can be referred to as the "V0" level of the interconnect structures of 3D memory device 200.

Method 300 proceeds to operation 318, as illustrated in FIG. 3, in which a plurality of third contacts in an interconnect conductor layer are formed. As illustrated in FIG. 10, interconnect conductor layer 246 (including a dielectric layer 1004 and contacts 250) is formed above contact layer 244. The upper end of each contact 250 can be flush with one another at the top surface of dielectric layer 1004, and the lower end of each contact 250 can be flush with one another at the bottom surface of dielectric layer 1004. Dielectric layer 1004 can be formed by one or more thin film deposition processes, such as ALD, CVD, PVD, any other suitable processes, or any combination thereof. Dielectric layer 1004 can include dielectric materials, including, but not limited to, silicon oxide, silicon nitride, silicon oxynitride, or any combination thereof. Contacts 250 can be formed through dielectric layer 1004 by first etching vertical openings (e.g., by wet etching and/or dry etching), followed by filling the openings with conductor materials using ALD, CVD, PVD, any other suitable processes, or any combination thereof. The conductor materials used to fill contacts 250 can include, but are not limited to, W, Co, Cu, Al, polysilicon, silicides, or any combination thereof. In some embodiments, other conductor materials are used to fill the openings to function as a barrier layer, an adhesion layer, and/or a seed layer.

As shown in FIG. 10, the lower end of each contact 250 can be in contact with the upper end of corresponding contact 248 in contact layer 244, so that each contact 250 can be electrically connected to a corresponding memory array structure, such as NAND strings 204, slit structures 228, substrate 202, and word line 206. In some embodiments, all contacts 250 in interconnect conductor layer 246 can be simultaneously formed in the same contact forming process. In some embodiments, each contact 250 is an interconnect line, and interconnect conductor layer 246 can be referred to as the "M0" level of the interconnect structures of 3D memory device 200. It is understood that in some embodiments, contacts 248 and contacts 250 are formed in a single contact forming process, such as a dual damascene process for forming Cu contacts. Nevertheless, as illustrated in FIGS. 8 and 9, the interconnect structures including local contacts and contacts 248 and 250 can be formed in a limited number of fabrication steps to reduce the fabrication complexity and cost.

Figure 11:
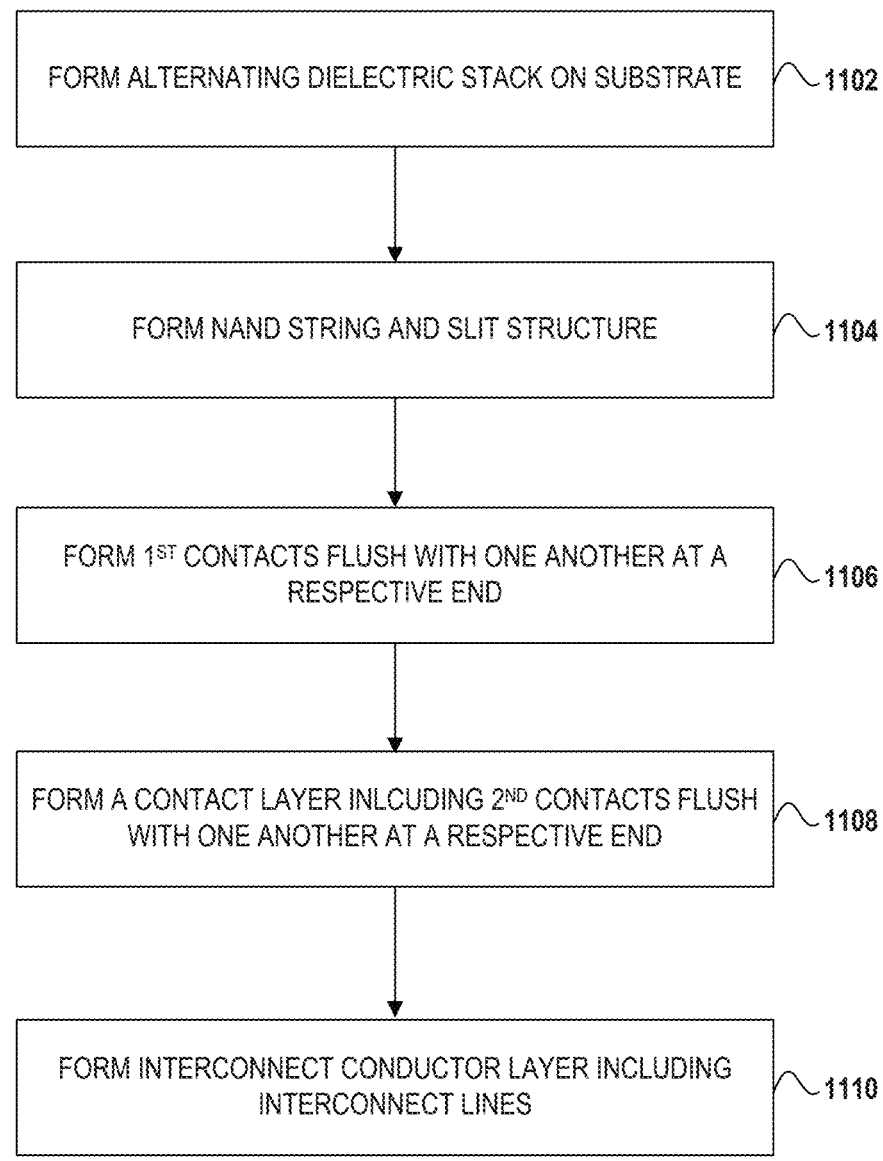
FIG. 11 is a flowchart of an exemplary method for forming a 3D memory device, according to some embodiments of the present disclosure.

FIG. 11 is a flowchart of an exemplary method 1100 for forming a 3D memory device, according to some embodiments of the present disclosure. An example of the 3D memory device described in FIG. 11 is 3D memory device 200 depicted in FIG. 2. It should be understood that the operations shown in method 1100 are not exhaustive and that other operations can be performed as well before, after, or between any of the illustrated operations.

Referring to FIG. 11, method 1100 starts at operation 1102, in which an alternating conductor/dielectric stack is formed. The alternating conductor/dielectric stack can include a staircase structure. Method 1100 proceeds to operation 1104, in which a NAND string and a slit structure are formed. Each of the NAND string and the slit structure can extend vertically through the alternating conductor/dielectric stack. Method 1100 proceeds to operation 1106, in which a plurality of first contacts (e.g., local contacts) flush with one another at a respective first end of each first contact are formed. Each of a first conductor layer of the alternating conductor/dielectric stack in the staircase structure, the NAND string, and the slit structure is in contact with a respective second end of the plurality of first contacts. Method 1100 proceeds to operation 1108, in which a contact layer including a plurality of second contacts is formed. The plurality of second contacts can be flush with one another at a respective first end and a respective second end of each second contact. Each of the plurality of second contacts can be in contact with a respective one of the plurality of first contacts. Method 1100 proceeds to operation 1110, in which an interconnect conductor layer including a plurality of interconnect lines (e.g., bit lines) are formed. Each of the plurality of second contacts can be in contact with a respective one of the plurality of interconnect lines.

Figure 12:
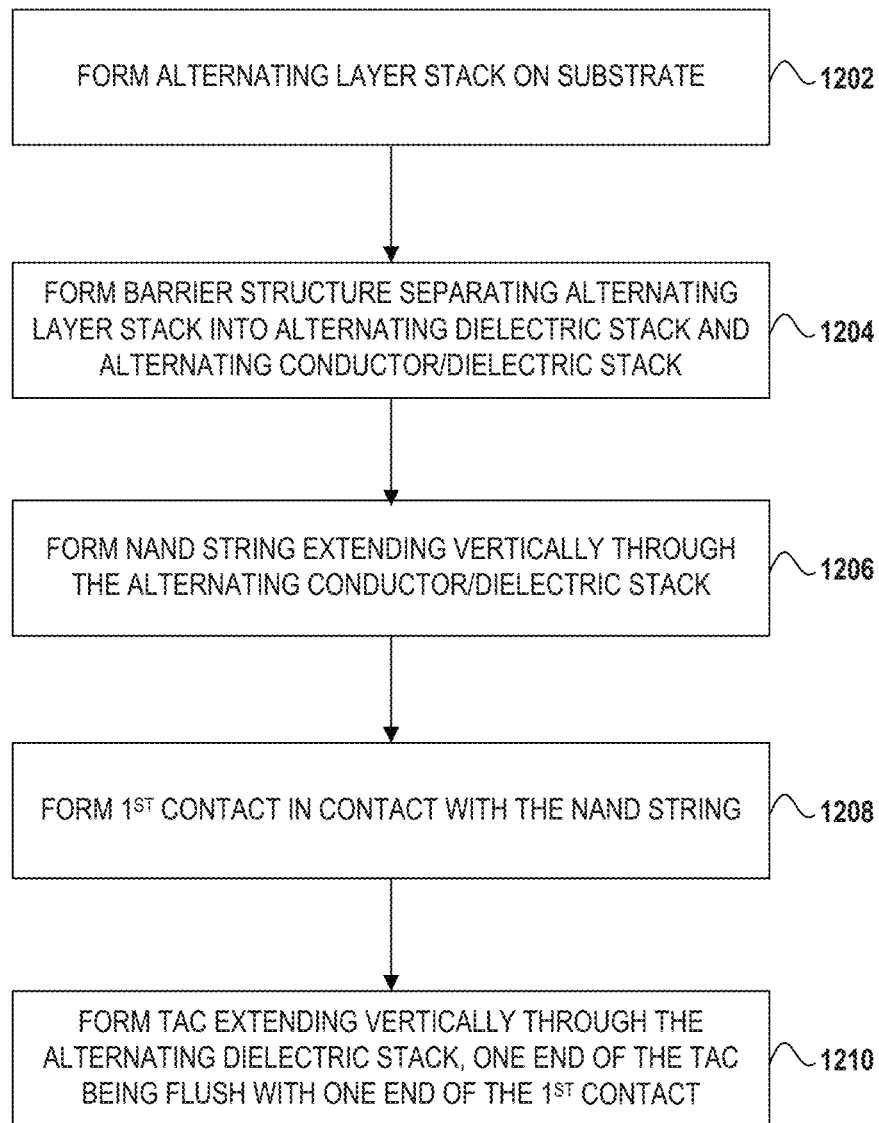
FIG. 12 is a flowchart of another exemplary method for forming a 3D memory device, according to some embodiments of the present disclosure.

FIG. 12 is a flowchart of another exemplary method 1200 for forming a 3D memory device, according to some embodiments of the present disclosure. An example of the 3D memory device described in FIG. 12 is 3D memory device 200 depicted in FIG. 2. It should be understood that the operations shown in method 1200 are not exhaustive and that other operations can be performed as well before, after, or between any of the illustrated operations.

Referring to FIG. 12, method 1200 starts at operation 1202, in which an alternating layer stack is formed on a substrate. Method 1200 proceeds to operation 1204, in which a barrier structure is formed. The barrier structure can extend vertically through the alternating layer stack, such that the alternating layer stack is separated laterally into an alternating dielectric stack including a plurality of dielectric layer pairs, and an alternating conductor/dielectric stack including a plurality of conductor/dielectric layer pairs. Method 1200 proceeds to operation 1206, in which a NAND string is formed. The NAND string can extend vertically through the alternating conductor/dielectric stack. Method 1200 proceeds to operation 1208, in which a first contact is formed. The first contact can include two ends, one of which can be in contact with the NAND string. Method 1200 proceeds to operation 1210, in which a TAC is formed. The TAC can extend vertically through the alternating dielectric stack. The TAC can include an end flush with an end of the first contact.

Various embodiments in accordance with the present disclosure provide a 3D memory device with interconnect structures for a memory array. The interconnect structures allow contacts to various memory array structures (e.g., NAND strings, gate line slits, word lines, etc.) to be fabricated in a limited number of steps (e.g., in a single step or in two steps), thereby reducing the process complexity and manufacturing cost. In some embodiments, the interconnect structures disclosed herein include bit lines in the top interconnect conductor layer, which is suitable for those 3D memory architectures in which the array device and the peripheral device formed on different substrates are joined by hybrid bonding in a face-to-face manner.

Moreover, the interconnect structures disclosed herein can include TACs for providing vertical interconnects between the stacked array device and peripheral device (e.g., for power bus and metal routing), thereby reducing metal levels and shrinking die size. In some embodiments, the TACs in the interconnect structures disclosed herein are formed through a stack of alternating dielectric layers, which can be more easily etched to form through holes therein compared with a stack of alternating conductor and dielectric layers.

In some embodiments, a NAND memory device includes a substrate, an alternating layer stack on the substrate and including a staircase structure, and a barrier structure extending vertically through the alternating layer stack. The alternating layer stack includes an alternating dielectric stack including a plurality of dielectric layer pairs enclosed laterally by at least the barrier structure, and an alternating conductor/dielectric stack including a plurality of conductor/dielectric layer pairs. The memory device further includes a channel structure and a slit structure each extending vertically through the alternating conductor/dielectric stack, an etch stop layer on an end of the channel structure, and a plurality of first contacts. Each of a conductor layer in the staircase structure, the etch stop layer, and the slit structure is in contact with a respective one of the plurality of first contacts.

In some embodiments, a 3D memory device includes a substrate, an alternating conductor/dielectric stack on the substrate and including a staircase structure, a NAND string and a slit structure each extending vertically through the alternating conductor/dielectric stack, and a plurality of first contacts flush with one another at a respective first end of each of the first contacts. Each of a conductor layer of the alternating conductor/dielectric stack in the staircase structure, the NAND string, and the slit structure is in contact with a respective second end of the plurality of first contacts.

In some embodiments, a 3D memory device includes a substrate, an alternating layer stack on the substrate, and a barrier structure extending vertically through the alternating layer stack. The barrier structure separates laterally the alternating layer stack into an alternating dielectric stack including a plurality of dielectric layer pairs, and an alternating conductor/dielectric stack including a plurality of conductor/dielectric layer pairs. The memory device further includes a NAND string extending vertically through the alternating conductor/dielectric stack, a TAC extending vertically through the alternating dielectric stack, and a first contact including a first end flush with a first end of the TAC, and a second end in contact with the NAND string.

In some embodiments, a method for forming a NAND memory device is disclosed. An alternating dielectric stack is formed on a substrate. The alternating dielectric stack includes a plurality of dielectric layer pairs, each of which includes a first dielectric layer and a second dielectric layer different from the first dielectric layer. A first staircase structure is formed in the alternating dielectric stack. A channel structure and a barrier structure each extending vertically through the alternating dielectric stack are formed. The barrier structure separates the alternating dielectric stack into a first portion enclosed laterally by at least the barrier structure, and a second portion including the first staircase structure. An etch stop layer is formed on an upper end of the channel structure. A slit is formed. First dielectric layers in the second portion of the alternating dielectric stack are replaced with conductor layers through the slit to form an alternating conductor/dielectric stack including a plurality of conductor/dielectric layer pairs. A slit structure is formed by depositing a conductor in the slit. A plurality of first contacts are formed. Each of a first conductor layer of the alternating conductor/dielectric stack in the first staircase structure, the etch stop layer, and the slit structure is in contact with one of the plurality of first contacts.

In some embodiments, a method for forming a 3D memory device is disclosed. An alternating conductor/dielectric stack including a staircase structure is formed. A NAND string and a slit structure each extending vertically through the alternating conductor/dielectric stack are formed. A plurality of first contacts flush with one another at a respective first end of each of the first contacts are formed. Each of a first conductor layer of the alternating conductor/dielectric stack in the staircase structure, the NAND string, and the slit structure is in contact with a respective second end of the plurality of first contacts.

In some embodiments, a method for forming a 3D memory device is disclosed. An alternating layer stack is formed on a substrate. A barrier structure extending vertically through the alternating layer stack is formed, such that the alternating layer stack is separated laterally into an alternating dielectric stack including a plurality of dielectric layer pairs, and an alternating conductor/dielectric stack including a plurality of conductor/dielectric layer pairs. A NAND string extending vertically through the alternating conductor/dielectric stack is formed. A first contact including a first end and a second end in contact with the NAND string is formed. A TAC extending vertically through the alternating dielectric stack is formed. The TAC includes a first end flush with the first end of the first contact.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) NAND memory device, comprising:
   a substrate;
   an alternating layer stack on the substrate, the alternating layer stack comprising a staircase structure;
   a barrier structure extending vertically through the alternating layer stack, wherein the alternating layer stack comprises (i) an alternating dielectric stack comprising a plurality of dielectric layer pairs enclosed laterally by at least the barrier structure, and (ii) an alternating conductor/dielectric stack comprising a plurality of conductor/dielectric layer pairs;
   a channel structure and a slit structure each extending vertically through the alternating conductor/dielectric stack;
   an etch stop layer on an end of the channel structure;
   a plurality of first contacts, an interconnect conductor layer, and a contact layer comprising a plurality of second contacts, wherein each of (i) a conductor layer of the alternating conductor/dielectric stack in the staircase structure, (ii) the etch stop layer, and (iii) the slit structure is electrically connected to the interconnect conductor layer by a corresponding first contact and a respective one of the plurality of second contacts.

2. The memory device of claim 1, wherein the etch stop layer comprises one or more of polysilicon, titanium, titanium nitride, and tungsten.

3. The memory device of claim 1, wherein the barrier structure comprises silicon oxide and silicon nitride.

4. The memory device of claim 1, further comprising a dummy channel structure extending vertically through the alternating conductor/dielectric stack.

5. The memory device of claim 1, wherein each of the plurality of dielectric layer pairs comprises a silicon oxide layer and a silicon nitride layer, and each of the plurality of conductor/dielectric layer pairs comprises a metal layer and a silicon oxide layer.

6. The memory device of claim 1, further comprising a third contact extending vertically through the alternating dielectric stack enclosed laterally by at least the barrier structure.

7. A three-dimensional (3D) memory device, comprising:
- a substrate;
- an alternating conductor/dielectric stack on the substrate, the alternating conductor/dielectric stack comprising a staircase structure;
- a NAND string and a slit structure each extending vertically through the alternating conductor/dielectric stack;
- a plurality of first contacts flush with one another at a respective first end of each of the first contacts, wherein each of (i) a conductor layer of the alternating conductor/dielectric stack in the staircase structure, (ii) the NAND string, and (iii) the slit structure is in contact with a respective second end of the plurality of first contacts;
- a contact layer comprising a plurality of second contacts flush with one another at a respective first end and a respective second end of each of the second contacts, wherein each of the plurality of second contacts is in contact with a respective one of the plurality of first contacts; and
- an interconnect conductor layer comprising a plurality of interconnect lines, wherein each of the plurality of second contacts is in contact with a respective one of the plurality of interconnect lines.

8. The memory device of claim 7, wherein the plurality of interconnect lines comprise a bit line electrically connected to the NAND string by a corresponding first contact and a corresponding second contact.

9. The memory device of claim 7, further comprising:
- a barrier structure; and
- an alternating dielectric stack separated laterally from the alternating conductor/dielectric stack by the barrier structure.

10. The memory device of claim 9, wherein the plurality of first contacts comprise a through array contact (TAC) extending vertically through the alternating dielectric stack.

11. The memory device of claim 7, wherein the NAND string comprises a plug in contact with a corresponding first contact.

12. The memory device of claim 11, wherein the plug comprises at least one of a polysilicon and a metal.

* * * * *